(12) United States Patent
Kim et al.

(10) Patent No.: US 6,496,065 B1
(45) Date of Patent: Dec. 17, 2002

(54) LINEAR AMPLIFIER USING FREQUENCY 2ND ORDER INTERMODULATION FEED-FORWARDING METHOD

(75) Inventors: Bum-man Kim, Pohang (KR); Youn-goo Yang, Pohang (KR); Sang-hoon Kang, Busan (KR)

(73) Assignee: Pohang University of Science and Technology Foundation, Kyungsanbuk-Do (KR)

( * ) Notice: Subject to any disclaimer, the term of this patent is extended or adjusted under 35 U.S.C. 154(b) by 0 days.

(21) Appl. No.: 09/699,344

(22) Filed: Oct. 31, 2000

(51) Int. Cl.$^7$ ................................................. H03F 1/00

(52) U.S. Cl. ........................ 330/151; 330/149; 330/306

(58) Field of Search ................................ 330/149, 151, 330/302, 306

(56) References Cited

U.S. PATENT DOCUMENTS

| | | | | |
|---|---|---|---|---|
| 5,276,406 A | * | 1/1994 | Samay et al. | 330/277 |
| 5,406,226 A | * | 4/1995 | Cioffi et al. | 330/306 |
| 6,052,029 A | * | 4/2000 | Uda et al. | 330/277 |
| 6,163,221 A | * | 12/2000 | Matsuno | 330/302 |

FOREIGN PATENT DOCUMENTS

| | | |
|---|---|---|
| JP | 6-214416 B | 3/1996 |
| JP | 7-062070 B | 9/1996 |

OTHER PUBLICATIONS

Yang et al.; A New Linear Amplifier Using low–frequency second order intermodulation Component Feedforwarding; IEEE Microwave and Guided Wave Letters, vol. 4, No. 10, Oct., 1999.*

Yang et al.; "A New Linear Amplifier Using Low–Frequency Second–Order Intermodulation Component Feedforwarding", *IEEE Microwave and Guided Wave Letters*, vol. 4, No. 10, Oct. 1999, pp. 419–421.

* cited by examiner

*Primary Examiner*—Benny Lee
*Assistant Examiner*—Henry Choe
(74) *Attorney, Agent, or Firm*—Leydig, Voit & Mayer, Ltd.

(57) ABSTRACT

A linear amplifier using a low frequency $2^{nd}$ intermodulation feed-forwarding method to offset the $3^{rd}$ intermodulation component of a fundamental signal is provided. This linear amplifier includes a transistor for amplifying the power of the fundamental signal, a first filter unit, one end of which is connected to the gate of the transistor, for filtering a $2^{nd}$ order intermodulation signal from the fundamental signal, a low frequency amplifier connected to the other end of the first filter unit, for amplifying the $2^{nd}$ order intermodulation signal with a predetermined voltage gain, and a second filter unit connected in series between the output port of the low frequency amplifier and the drain output port of the transistor, for filtering the amplified $2^{nd}$ intermodulation signal and feeding the same to the output port of the transistor. This linear amplifier feeds the low frequency $2^{nd}$ order intermodulation component of a fundamental signal forward to the output port of a power amplification transistor, thereby maintaining the stable characteristics of a circuit adopting a feed-forwarding method and favorably offsetting a $3^{rd}$ intermodulation component that is adjacent to the frequency of the fundamental signal.

4 Claims, 4 Drawing Sheets

LINEAR AMPLIFIER USING FREQUENCY 2ND ORDER INTERMODULATION FEED-FORWARDING METHOD

BACKGROUND OF THE INVENTION

1. Field of the Invention

The present invention relates to a linear amplifier, and more particularly, to a linear amplifier using a low frequency $2^{nd}$ order intermodulation feed-forwarding method.

2. Description of the Related Art

When a mobile terminal or a mobile base station power-amplifies and transmits a signal, the receiving sensitivity of a receiving side is degraded by distortion due to the interference between a fundamental signal to be transmitted and its intermodulation component.

In order to solve the above problem, conventional linear amplifiers shown in FIGS. 1A, 1B and 2 are used. Each of the conventional linear amplifiers roughly includes an input impedance matching unit ($Z_s$) 20 for matching the output impedance of a signal source Vs with the input impedance of the input port of a transistor 12, 14 or 24, and an output impedance matching unit ($Z_L$) 29 impedance-matching the output port of the transistor 12, 14 or 24 with an output load. An amplifier shown in FIG. 1A tunes to a distortion component signal using a source harmonic tuning method and reflects an intermodulation signal reflected by the gate of the transistor 12 back to the gate using a reflection coefficient control unit 17 having a variable capacitor or a stub at the gate port of the transistor 12, thereby offsetting a distortion component. In FIG. 1B, a reflection coefficient control unit 16 is installed to the rear of the transistor 14, and tunes a harmonic output from the rear of the transistor 14 and reflects the harmonic back to the gate using a load harmonic tuning method, thereby offsetting a $3^{rd}$ order harmonic component.

FIG. 2 shows a linear amplifier using an intermodulation signal feed-backwarding method. The linear amplifier of FIG. 2 includes an amplification transistor 24, filters 25 and 28 for filtering a $2^{nd}$ order harmonic component from an input signal, a phase shifting unit 26 for shifting the phase of the $2^{nd}$ order harmonic component, and an amplifier 27 for amplifying the phase-shifted $2^{nd}$ order harmonic component to a predetermined value. The phase-shifted $2^{nd}$ order intermodulation signal is fed backward to the input port of the amplification transistor 24, thereby offsetting a $3^{rd}$ order intermodulation component.

However, these conventional intermodulation signal tuning methods can offset only several dB of $3^{rd}$ order harmonic component. In the intermodulation signal feed-backwarding method, 10 dB to 15 dB of intermodulation component can be offset, but the characteristics is unstable and the band is narrowed.

SUMMARY OF THE INVENTION

An objective of the present invention is to provide a linear amplifier using a low frequency $2^{nd}$ order intermodulation feed-forwarding method for offsetting a $3^{rd}$ intermodulation component while maintaining the stable characteristics of a linear amplification circuit obtained by feed-forwarding.

To achieve the above objective, the present invention provides a linear amplifier using a low frequency $2^{nd}$ intermodulation feed-forwarding method to offset the $3^{rd}$ intermodulation component of a fundamental signal, the device including: a transistor for amplifying the power of the fundamental signal; an input impedance matching unit connected to the gate of the transistor for impedance-matching a source of the received fundamental signal with the gate of the transistor; a first filter unit, one end of which is connected to the gate of the transistor, for filtering a $2^{nd}$ order intermodulation signal from the fundamental signal; a low frequency amplifier connected to the other end of the first filter unit, for amplifying the $2^{nd}$ order intermodulation signal with a predetermined voltage gain; a second filter unit connected in series between the output port of the low frequency amplifier and the drain output port of the transistor, for filtering the amplified $2^{nd}$ intermodulation signal and feeding the same to the output port of the transistor; and an output impedance matching unit connected to the output port of the transistor for impedance-matching the output port of the transistor with an external load.

The voltage gain ($\beta$) of the low frequency amplifier $$-\frac{gm_3 \cdot C_0}{gmd \cdot C_1}.$$

The $gm_3$ and $gmd$ are the coefficients of terms $v_{gs}(t)^3$ and $V_{gs}(t)v_{ds}(t)$, respectively, of Equation:

$$i_{ds}[v_{gs}, v_{ds}] = gm \cdot v_{gs}(t) + gd \cdot v_{gs(t)} + gm_2 \cdot$$
$$v_{gs}(t)^2 + gmd \cdot v_{gs}(t) v_{ds}(t) +$$
$$gd_2 \cdot v_{ds}(t)^2 + gm_3 \cdot v_{gs}(t)^3 + gm_2 d \cdot$$
$$v_{gs}(t)^2 \cdot v_{ds}(t) +$$
$$gmd_2 \cdot v_{gs}(t) \cdot v_{ds}(t)^2 + gd_3 \cdot v_{ds}(t)^3 + \ldots$$

which is a Taylor series extension formula of the drain-source non-linear current $i_{ds}[v_{gs}, v_{ds}]$ of the transistor.

Also, C0 and C1 in the voltage gain are the coefficients of the constant term and term $v_{gs}(t)$ in Equation $C_{gs}[v_{gs}(t)] = C_0 + C_1 \cdot v_{gs}(t) + C_2 \cdot v_{gs}(t)^2 + \ldots$, which is a power series of a gate source capacitor of the transistor.

BRIEF DESCRIPTION OF THE DRAWINGS

The above objective and advantage of the present invention will become more apparent by describing in detail a preferred embodiment thereof with reference to the attached drawings in which.

DESCRIPTION OF THE PREFERRED EMBODIMENT

Figure 1A:
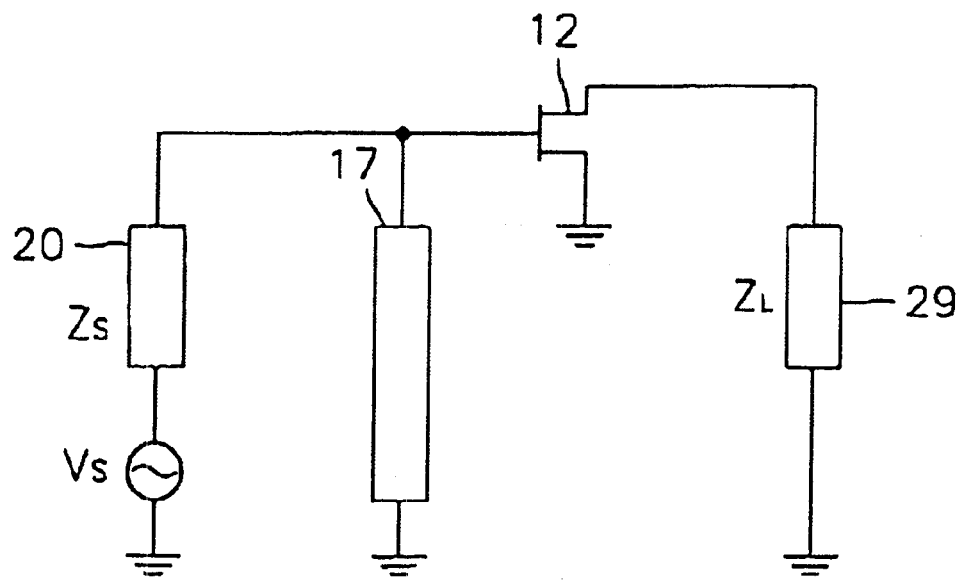
FIGS. 1A and 1B are block diagrams of conventional linear amplifiers each including a harmonic tuning circuit.
Figure 1B:
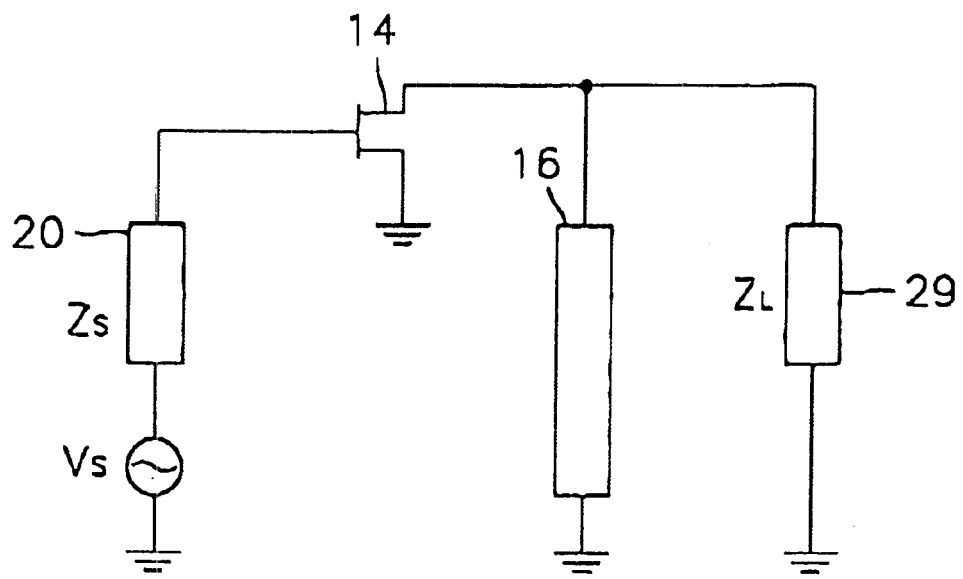
Figure 2:
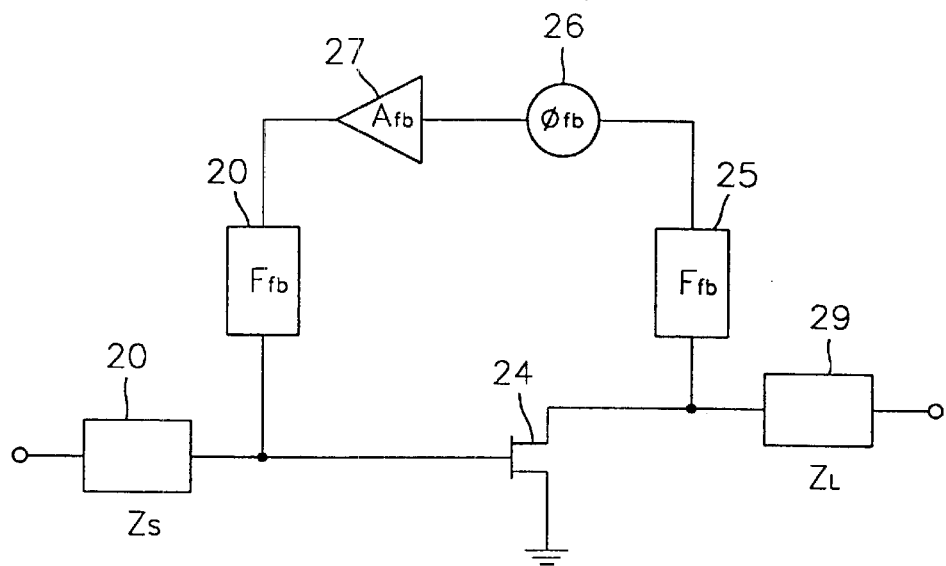
FIG. 2 is a block diagram of a conventional linear amplifier including a circuit for feeding an intermodulation component backward using a $2^{nd}$ order intermodulation component.
Figure 3:
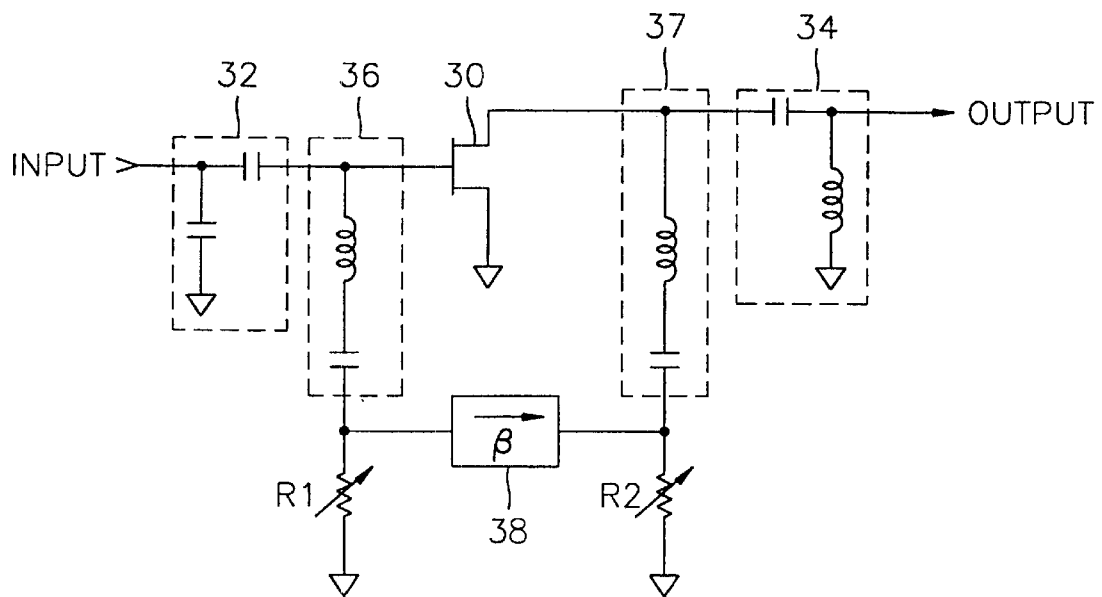
FIG. 3 is a circuit diagram of a linear power amplification circuit using a $2^{nd}$ order intermodulation feed-forwarding method according to the present invention.
Figure 4A:
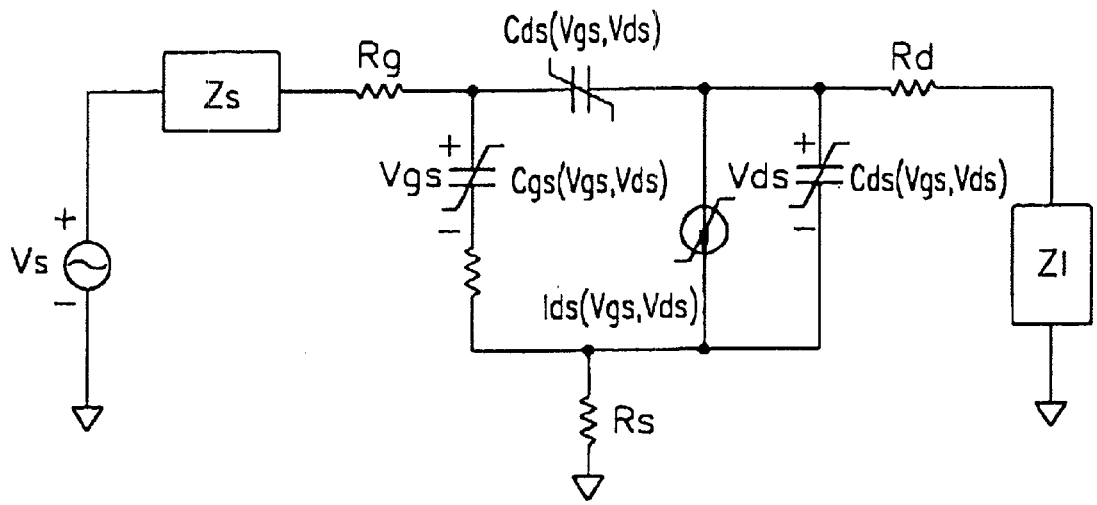
FIG. 4A is an equivalent circuit diagram of the circuit of FIG. 3 with respect to a high frequency.

FIG. 3 shows a low frequency $2^{nd}$ order intermodulation feed-forwarding amplifier according to the present invention. FIG. 4A shows the equivalent circuit of FIG. 3 which is applied to a fundamental signal, that is, a high frequency signal, and FIG. 4B shows the equivalent circuit of FIG. 3 which is applied to a $2^{nd}$ order harmonic component, that is, a low frequency signal.

In the fundamental signal processing shown in FIG. 3, a fundamental signal from a signal source $V_S$ is applied to the gate of a transistor 30 via an input impedance matching unit 32 and power-amplified and output to the drain. An output impedance matching unit 34 impedance-matches the amplified signal with an output load. A first direct current blocking filter 36, an amplifier 38 and a second direct current blocking filter 37 are serially connected to each other between the gate, which is an input port, and the drain, which is an output port, such that a $2^{nd}$ intermodulation signal is fed forward.

Figure 4B:
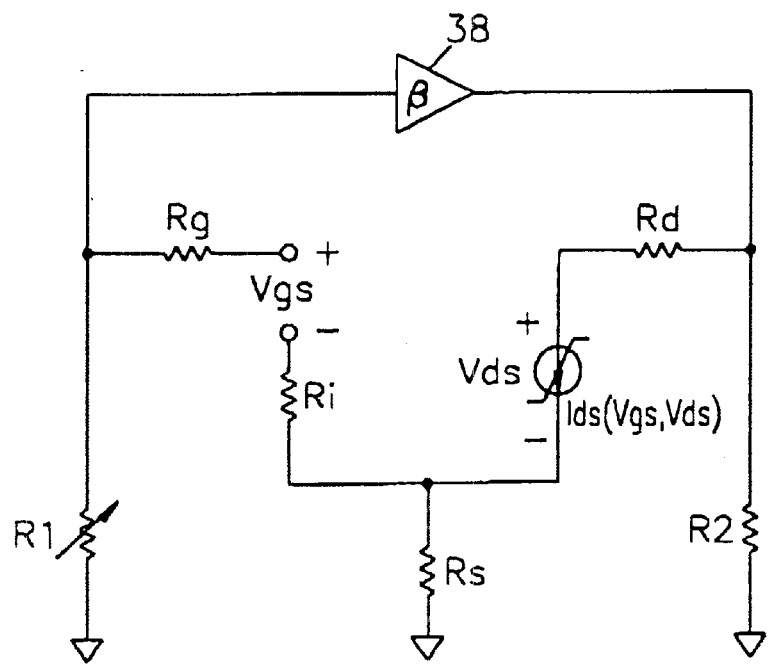
FIG. 4B is an equivalent circuit diagram of the circuit of FIG. 3 with respect to a low frequency.

In FIGS. 4A and 4B, reference character Rs denotes the gate resistance of the transistor 30, reference character Rd denotes the drain resistance of the transistor 30, reference character Ri denotes an input resistance, and reference character Rs is a source resistance. An impedance component due to capacitance is particularly greater than other shown parameters. Accordingly, when Rs, Rd, Ri and Rg are set to be 0, a drain-source nonlinear channel current $i_{ds}[v_{gs}, v_{ds}]$ is obtained by Taylor series expension from Equation 1:

$$i_{ds}[v_{gs}, v_{ds}] = gm \cdot v_{gs}(t) +$$
$$gd \cdot v_{ds(t)} + gm_2 \cdot v_{gs}(t)^2 +$$
$$gmd \cdot v_{gs}(t) v_{ds}(t) +$$
$$gd_2 \cdot v_{ds}(t)^2 + gm_3 \cdot v_{gs}(t)^3 + gm_2 d \cdot v_{gs}(t)$$
$$2 \cdot v_{ds}(t) +$$
$$gmd_2 \cdot v_{gs}(t) \cdot v_{ds}(t)^2 +$$
$$gd_3 \cdot v_{ds}(t)^3 + \ldots \qquad (1)$$

wherein a first order coefficient gm denotes transconductance, gd denotes output conductance, and $v_{gs}$ and $v_{ds}$ denote the alternating current (AC) voltage of a gate voltage and that of a drain voltage, respectively. When 2 tone input signals $f_1$ and $f_2$ are applied to the gate of the transistor 30, Equation 2 is established:

$$v_{gs}(t) = A_1 \cdot \cos(2\pi f_1 t) + A_2 \cdot \cos(2\pi f_2 t) \qquad (2)$$
$$= \frac{1}{2}[A_1 \cdot \exp(j2\pi f_1 t) + A_1 \cdot \exp(-j2\pi f_1 t)] +$$
$$\frac{1}{2}[A_2 \cdot \exp(j2\pi f_2 t) + A_2 \cdot \exp(-j2\pi f_2 t)]$$
$$= \frac{1}{2}[V_{gs-f_1} + V^*_{gs-f_1}] + \frac{1}{2}[V_{gs-f_2} + V^*_{gs-f_2}]$$

wherein $V_{gs-f_1}$ is equal to $A_1 \exp(j2nf_1)$, $V_{gs-f_2}$ is equal to $A_2 \exp(j2nf_2)$, $V^*_{gs-f_1}$ is equal to $A_1 \exp(-j2nf_1)$, $V^*_{gs-f_2}$ is equal to $A_2 \exp(-j2nf_2)$, 2-ton input signals $f_1$ and $f_2$ are signals within a bandwidth in a fundamental signal, and $A_1$ and $A_2$ denote the magnitudes of signals $f_1$ and $f_2$, respectively.

When Equation 2 is substituted for Equation 1, the current of a main $3^{rd}$ intermodulation component $(2f_2-f_1)$ is expressed as a term combined with a $3^{rd}$ coefficient $gm_3$ in Equation 1, as in Equation 3:

$$i_{ds}(t)|_{2f_2-f_1}^{gm_3} = \tfrac{3}{4} gm_3 \cdot A_2^2 \cdot A_1 \cdot \cos[2\pi(2f_2-f_1)t] \qquad (3)$$

The harmonic component $i_{gs}(t)$ of a gate current due to the non-linearity of a gate-source capacitor ($C_{gs}$) can be expressed by the input voltage $v_{gs}$ of the transistor 30, as in Equation 4:

$$i_{ds}(t) = [C_0 + C_1 \cdot v_{gs}(t) + C_2 \cdot v_{gs}(t)^2 + \ldots] \frac{dv_{ds}(t)}{dt} \qquad (4)$$

Since $C_{gs}[v_{gs}(t)]$ is equal to $C_0 + C_1 \cdot v_{gs}(t) + C_2 \cdot v_{gs}(t)^2 + \ldots$ a low frequency $2^{nd}$ order intermodulation component in Equation 4 can be expressed as in Equation 5:

$$i_{ds}(t)|_{f_2-f_1} j \tfrac{1}{2} C_1 (f_2-f_1) [V_{gs-f_2} \cdot V^*_{gs-f_1} - V_{gs-f_1} \cdot V^*_{gs-f_2}] \qquad (5)$$

A gate voltage for a $2^{nd}$ intermodulation component can be obtained using Equation 5 as in Equation 6:

$$v_{gs}(t)|_{f_2-f_1} \approx \frac{1}{C_0} \int i_{gs}(t) \bigg|_{f_2-f_1} dt \qquad (6)$$
$$= \frac{C_1}{4C_0}[V_{gs-f_2} \cdot V^*_{gs-f_1} + V_{gs-f_1} \cdot V^*_{gs-f_2}]$$
$$= \frac{C_1}{2C_0} A_2 \cdot A_1 \cdot \cos[2\pi(f_2-f_1)t]$$

When the $2^{nd}$ order intermodulation component $f_2-f_1$ is amplified by a low frequency amplifier 38 and applied to the drain port, a drain voltage is calculated by Equation 7:

$$\hat{v}_{ds}(t) = v_{ds}(t) + \beta \cdot v_{ds}(t)|_{f_2-f_1} \qquad (7)$$

wherein $\beta$ denotes the voltage gain of the low frequency amplifier 38, and $v_{ds}(t)$ denotes a drain voltage when feed-forwarding is not performed.

When Equation 7 is substituted for Equation 1, a new $3^{rd}$ order intermodulation current can be obtained. The new $3^{rd}$ intermodulation component is obtained by the interaction between an amplified $2^{nd}$ order intermodulation component and a $1^{st}$ order main signal, and is expressed as the product of gmd and $gd_2$, which are $2^{nd}$ order coefficients. However, since generally gmd>>$gd_2$, a main distortion component due to gmd is expressed as in Equation 8:

$$\hat{i}_{ds}(t)|_{2f_2-f_1}^{gmd} = \frac{gmd \cdot \beta \cdot C_1 \cdot A_2^2 \cdot A_1}{4C_0} \cos[2\pi(2f_2-f_1)t] \qquad (8)$$

A main $3^{rd}$ order intermodulation component output when, not amplified using a feed-forwarding method from Equation 3, can be offset by a $3^{rd}$ order intermodulation component generated from the amplified $2^{nd}$ intermodulation component from Equation 8. Hence, under an ideal condition in which the sum of Equations 3 and 8 is set to be 0, the voltage gain ($\beta$) of the low frequency amplifier 38 is calculated by Equation 9:

$$\beta = -\frac{gm_3 \cdot C_0}{gmd \cdot C_1} \qquad (9)$$

As shown in Equation 9, the voltage gain ($\beta$) of the low frequency amplifier 38, which is a pure real number value, is a constant which has no dependency on $A_1$ and $A_2$ which are the magnitudes of the input voltages of 2-tone signals $f_1$ and $f_2$, respectively. Thus, even if the input voltages of the 2-tone signals $f_1$ and $f_2$ are changed to some extent, the linearity of a linear amplifier using a feed-forwarding method according to the present invention is considerably stably maintained, and a phase change in a significantly low frequency is so negligible that there is no need to adjust the phase.

Figure 5:
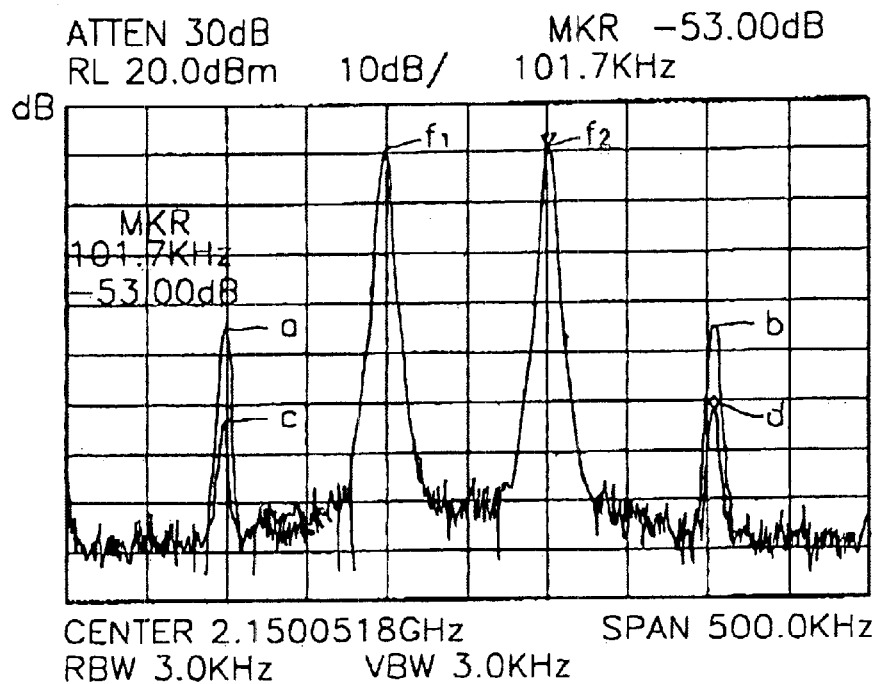
FIG. 5 shows output signals depending on whether a low frequency $2^{nd}$ order intermodulation feed-forwarding circuit is adopted, when 2-ton signals $f_1$ and $f_2$ are input to the circuit of FIG. 3.

In FIG. 5, when 2 ton frequency $f_1$ and $f_2$ included within a band are applied to a linear amplifier according to the present invention at a central frequency of 2.15 GHz, a $3^{rd}$ intermodulation component has magnitudes a and b in case that a $2^{nd}$ intermodulation component is not fed forward, and the $3^{rd}$ intermodulation component has magnitudes c and d in case that the $2^{nd}$ intermodulation component is fed forward. It can be seen from FIG. 5 that the $3^{rd}$ order intermodulation component is improved by 18 dB in case that the $2^{nd}$ intermodulation component is fed forward.

Figure 6:
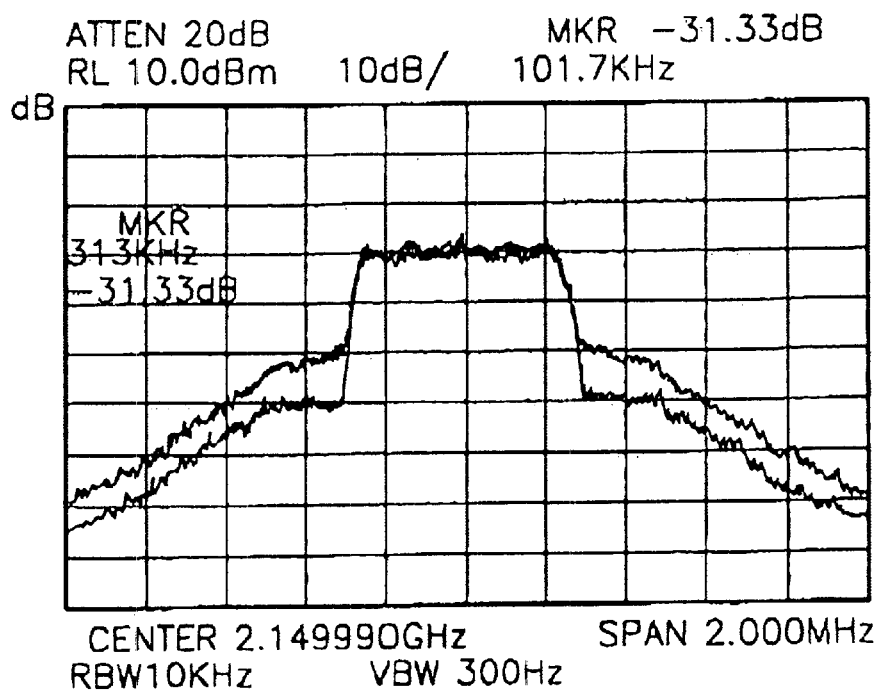
FIG. 6 shows output signals depending on whether a low frequency $2^{nd}$ order intermodulation feed-forwarding circuit is adopted, when a code division multiple access (CDMA) signal is input to the circuit of FIG. 3.

FIG. 6 shows output signals with respect to an input code division multiple access (CDMA) signal, depending on whether the circuit of FIG. 3 adopts a low frequency $2^{nd}$ order intermodulation feed-forwarding method. It can be seen from FIG. 6 that an adjacent channel power ratio (ACPR) is improved by 10 dB.

In the above embodiment of the present invention, an amplifier has been limited to a transistor. However, it is apparent that the parameters for the transistor can also be adopted in general power amplification transistors by one of ordinary skill in the art.

A linear amplifier according to the present invention feeds the low frequency $2^{nd}$ order intermodulation component of a fundamental signal forward to the output port of a power amplification transistor, thereby maintaining the stable characteristics of a circuit adopting a feed-forwarding method and favorably offsetting a $3^{rd}$ intermodulation component that is adjacent to the frequency of the fundamental signal.

What is claimed is:

1. A linear amplifier using a low frequency 2nd intermodulation feed-forwarding method to offset a 3rd intermodulation component of a fundamental signal, the device comprising:

a transistor for amplifying a fundamental signal, the transistor having a gate, drain, and an output port;

an input impedance matching unit connected to the gate of the transistor for impedance-matching a source of the fundamental signal with the gate of the transistor;

a first filter unit, a first end of which is connected to the gate of the transistor, for filtering a 2nd order intermodulation signal from the fundamental signal;

a low frequency amplifier connected to a second end of the first filter unit, for amplifying the 2nd order intermodulation signal with a voltage gain;

a second filter unit connected in series between an output port of the low frequency amplifier and the drain of the transistor, for filtering the amplified 2nd intermodulation signal and feeding the amplified 2nd intermodulation signal after filtering to the output port of the transistor; and an output impedance matching unit connected to the output port of the transistor for impedance-matching the output port of the transistor with an external load.

2. The linear amplifier of claim 1, wherein the voltage gain ($\beta$) of the low frequency amplifier is $$-\frac{gm_3 \cdot C_0}{gmd \cdot C_1}.$$

3. The linear amplifier of claim 2, wherein $gm_3$ and $gmd$ are the coefficients of terms $v_{gs}(t)^3$ and $v_{gs}(t)v_{ds}(t)$, respectively, $$i_{ds}[v_{gs}, v_{ds}] = gm \cdot v_{gs}(t) +$$

$$gd \cdot v_{ds(t)} + gm_2 \cdot v_{gs}(t)^2 + gmd \cdot v_{gs}(t)v_{ds}(t) +$$

$$gd_2 \cdot v_{ds}(t)^2 + gm_3 \cdot v_{gs}(t)^3 +$$

$$gm_2d \cdot v_{gs}(t)^2 \cdot v_{ds}(t) +$$

$$gmd_2 \cdot v_{gs}(t) \cdot v_{ds}(t)^2 + gd_3 \cdot v_{ds}(t)^3 + \ldots$$

which is a Taylor series expanstion of the drain-source non-linear curren $$i_{ds}[V_{gs}, V_{ds}]$$

of the transistor.

4. The linear amplifier of claim 3, wherein C0 and C1 are coefficients of a constant term and $v_{gs}(t)$ in Equation $C_{gs}[v_{gs}(t)] = C_0 + C_1 \cdot v_{gs}(t) + C_2 \cdot v_{gs}(t)^2 + \ldots$, is a power series of a gate source capacitor of the transistor.

* * * * *